(12) United States Patent
Yanwei

(10) Patent No.: US 9,964,258 B2
(45) Date of Patent: May 8, 2018

(54) LIGHT EMITTING DIODE (LED) LIGHTING DEVICE

(71) Applicant: FEIT ELECTRIC COMPANY, INC., Pico Rivera, CA (US)

(72) Inventor: Shen Yanwei, Zhejiang (CN)

(73) Assignee: FEIT ELECTRIC COMPANY, INC., Pico Rivera, CA (US)

( * ) Notice: Subject to any disclaimer, the term of this patent is extended or adjusted under 35 U.S.C. 154(b) by 76 days.

(21) Appl. No.: 15/042,246

(22) Filed: Feb. 12, 2016

(65) Prior Publication Data

US 2017/0159891 A1 Jun. 8, 2017

Related U.S. Application Data

(63) Continuation-in-part of application No. 15/042,264, filed on Feb. 12, 2016.

(30) Foreign Application Priority Data

Dec. 2, 2015 (CN) .......................... 2015 1 0874039
Dec. 2, 2015 (CN) ...................... 2015 2 0988813 U

(51) Int. Cl.
*F21V 23/00* (2015.01)
*F21V 19/00* (2006.01)
*F21K 9/237* (2016.01)
*F21K 9/232* (2016.01)
*F21K 9/238* (2016.01)
(Continued)

(52) U.S. Cl.
CPC .............. *F21K 9/237* (2016.08); *F21K 9/232* (2016.08); *F21K 9/238* (2016.08); *F21V 19/003* (2013.01); *F21V 23/005* (2013.01); *F21V 29/89* (2015.01); *F21Y 2115/10* (2016.08)

(58) Field of Classification Search
CPC .......... F21K 9/232; F21K 9/237; F21K 9/238; F21V 29/89; F21V 23/005; F21V 19/003
See application file for complete search history.

(56) References Cited

U.S. PATENT DOCUMENTS 8,421,321 B2 * 4/2013 Chuang .................. F21K 9/232
313/46
8,449,154 B2 * 5/2013 Uemoto ................ F21V 23/009
257/98
(Continued)

FOREIGN PATENT DOCUMENTS

CN 102997102 A 3/2013

OTHER PUBLICATIONS

United States Patent and Trademark Office, Office Action for U.S. Appl. No. 15/042,264, dated Jun. 29, 2017, 15 pages, U.S.A.

*Primary Examiner* — Alan Cariaso
(74) *Attorney, Agent, or Firm* — Alston & Bird LLP

(57) ABSTRACT

Various embodiments provide a light emitting diode (LED) module, an LED lighting device comprising an LED module, and methods for manufacturing an LED module and/or an LED lighting device. In one embodiment, the LED lighting device comprises a housing comprising a metal shell and defining a central opening; and an LED module having one or more LEDs mounted about a periphery of a first surface of the LED module. The LED module is oriented and retained within the central opening of the housing such that the first surface faces out of the central opening. Furthermore, the LED module is secured to the housing via the metal shell.

20 Claims, 15 Drawing Sheets

(51) Int. Cl.
*F21V 29/89* (2015.01)
*F21Y 115/10* (2016.01)

(56) References Cited

U.S. PATENT DOCUMENTS

| | | | |
|---|---|---|---|
| 8,760,042 B2* | 6/2014 | Sakai | F21V 23/002 |
| | | | 313/324 |
| 9,052,104 B2* | 6/2015 | Watanabe | B29C 45/14467 |
| 9,175,814 B2 | 11/2015 | Shida et al. | |
| 9,297,501 B2 | 3/2016 | Chou et al. | |
| 2011/0101861 A1* | 5/2011 | Yoo | F21V 3/02 |
| | | | 315/35 |
| 2011/0109217 A1* | 5/2011 | Kang | F21V 29/004 |
| | | | 313/46 |
| 2013/0063945 A1* | 3/2013 | Wu | F21V 19/045 |
| | | | 362/249.02 |
| 2013/0200402 A1 | 8/2013 | Yang | |
| 2013/0271998 A1* | 10/2013 | Merschon | F21V 7/0058 |
| | | | 362/294 |
| 2016/0348884 A1* | 12/2016 | Reier | F21V 29/70 |

* cited by examiner

LIGHT EMITTING DIODE (LED) LIGHTING DEVICE

BACKGROUND

Incandescent bulbs are slowly being phased out in favor of more efficient lighting sources. This led to an increased use of compact fluorescent bulbs which are more efficient than incandescent bulbs, but which tend to contain dangerous materials, such as mercury. Additionally, many people find the color temperature of light emitted by compact fluorescent bulbs to not be aesthetically pleasing for many applications, such as household lighting in kitchens, bathrooms, and living rooms; some commercial applications; and the like.

Recent advances in manufacturing light emitting diodes (LEDs) combined with the efficiency and long lifetime of LEDs have led to an increase in the availability and affordability of LED lighting devices. LED lighting devices offer advantages over compact fluorescent bulbs including longer lifetime and the absence of dangerous materials. Also, LED lighting devices may be configured to emit light in a wide range of color temperatures.

Both incandescent bulbs and compact fluorescent bulbs must be designed to maintain a specific environment within the bulb (e.g., a vacuum or a specific mix of gasses). LEDs, by contrast, can function under regular atmospheric conditions. However, LEDs are small, solid state devices, often require being powered via electronic driver circuitry, and have particular requirements for the dissipation of heat created by and/or in the vicinity of the LEDs.

Thus, there is a need for LED lighting devices in traditional bulb form factors.

BRIEF SUMMARY

Various embodiments of the present invention provide an LED module, an LED lighting device (e.g., light bulb, lamp, lighting fixture or the like) incorporating one or more LED modules, and methods for manufacturing an LED module and/or an LED lighting device comprising one or more LED modules.

According to one aspect of the present invention, an LED lighting device is provided. In one embodiment, the LED lighting device comprises a housing comprising a metal shell and defining a central opening and an LED module having one or more LEDs mounted about a periphery of a first surface of the LED module. The LED module is oriented and retained within the central opening of the housing such that the first surface faces out of the central opening. The LED module is secured to the housing via the metal shell.

According to another aspect of the present invention, an LED module is provided. In one embodiment, the LED module comprises a circuit board having a first surface; a peripheral metal board abutting and about said circuit board; an electrical insulation layer on the first surface of said circuit board and on said peripheral metal board; electrical traces on said electrical insulation layer; and one or more LEDs mounted on said electrical traces and said electrical insulation layer and over said peripheral metal board.

According to another aspect of the present invention, an LED lighting device is provided. In one embodiment, the LED lighting device comprises a housing. The housing comprises a metal shell defining a central opening of the housing; a plastic housing over molded onto the metal shell; and a metal insert mounted within the central opening of the housing. The LED lighting device further comprises an LED module mounted within the central opening of the housing. The LED module comprises a composite board. The composite board comprises a peripheral metal board having an embedding opening; and a circuit board embedded within the embedding opening of the peripheral metal board. The LED module further comprises one or more driver circuitry components mounted within a first portion of the composite board corresponding to the circuit board and one or more LEDs mounted about a periphery of a second portion of the composite board corresponding to the peripheral metal board.

According to still another aspect of the present invention, an LED lighting device is provided. In one embodiment, the LED lighting device comprises a housing. The housing comprises a metal shell defining a central opening of the housing; a plastic housing over molded onto the metal shell; and a metal insert mounted within the central opening of the housing. The LED lighting device further comprises an LED module mounted within the central opening of the housing. The LED module comprises a composite board having a first surface and a second surface opposite the first surface. The composite board comprises a peripheral metal board having an embedding opening; and a circuit board embedded within the embedding opening of the peripheral metal board. The LED module further comprises one or more driver circuitry components mounted to the first surface of the composite board and within a first portion of the composite board corresponding to the circuit board; one or more driver circuitry components mounted to the second surface of the composite board and within the first portion of the composite board corresponding to the circuit board; and one or more LEDs mounted to the first surface of the composite board and about a periphery of a second portion of the composite board corresponding to the peripheral metal board.

According to yet another aspect of the present invention, a method for manufacturing an LED lighting device is provided. In one embodiment, the method comprises die cutting a peripheral metal board. The peripheral metal board comprises an embedding opening. The method further comprises press-fitting a circuit board into the embedding opening such that a first surface of the circuit board is generally flush with a first surface of the peripheral metal board. The method further comprises adhering copper foil to at least the first surface of the peripheral metal board and the first surface of the circuit board using a partially dry adhesive that cures to become an electrical insulation layer, etching electrical traces from the copper foil, and mounting one or more LEDs on the electrical traces and the electrical insulation layer over the peripheral metal board. The method further comprises securing the peripheral metal board and the circuit board within a central opening of a metal shell.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF VARIOUS EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

I. OVERVIEW

Figure 1:
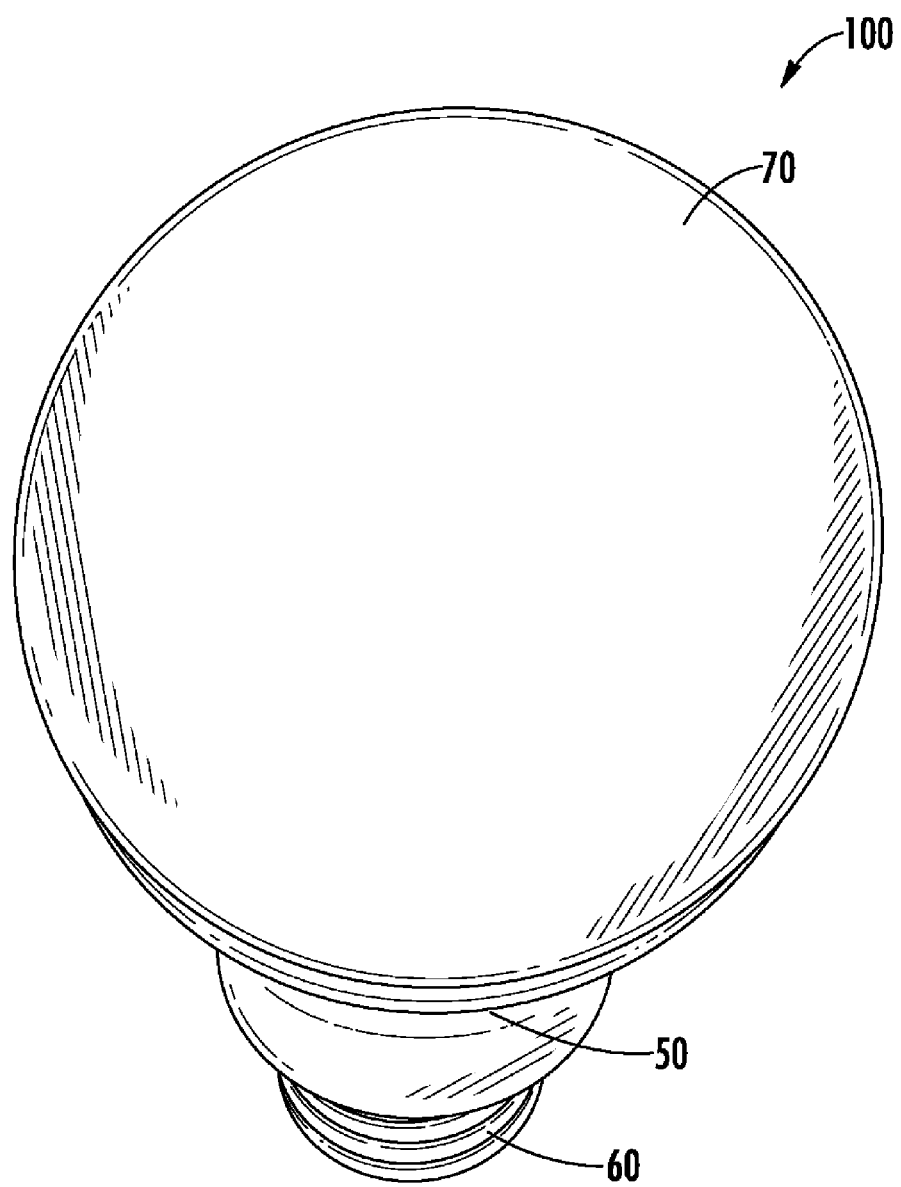
FIG. 1 is a perspective view of an LED lighting device, in accordance with various embodiments of present invention.

A light emitting diode (LED) lighting device may be an LED light bulb, lamp, lighting fixture or the like. FIG. 1 shows a perspective view of an example LED lighting device 100. The illustrated embodiment of a bulb type LED lighting device 100 comprises a lamp envelope 70, a housing 50, and a base 60.

In example embodiments, the base 60 may be configured to allow the LED lighting device 100 to be screwed or otherwise secured into a light socket (e.g., the light socket of a generic lamp, lighting fixture, and/or the like), and to receive electrical energy therethrough. For example, the base 60 may be an Edison type base, A19 base, and/or the like. In various embodiments, the base 60 may be configured to physically secure the LED lighting device 100 into a socket and provide an electrical connection between the driver circuitry (e.g., comprising one or more driver circuitry components 40) and a power supply (e.g., line voltage, a battery). Some embodiments of the LED lighting device 100 may not comprise a base. For example, embodiments of the LED lighting device that are lamps or lighting fixtures may comprise a housing that is configured to be mounted to a wall or ceiling or placed on a surface (e.g., table, desk, counter, etc.).

In various embodiments, a lamp envelope 70 may be configured to disperse the light emitted by one or more LEDs 30 (see FIG. 2) mounted within the LED lighting device 100, to enclose the one or more LEDs 30 within the LED lighting device 100, and/or to provide the LED lighting device 100 with a particular aesthetic. For example, in example embodiments, the lamp envelope 70 may be a globe or bulb. In the illustrated embodiment, the lamp envelope 70 is configured to provide the LED lighting device 100 with the appearance of an incandescent light bulb. In various embodiments, the lamp envelope 70 may comprise and/or be configured to accommodate secondary optical components configured to condition the light emitted by the one or more LEDs. In example embodiments, the lamp envelope 70 may be configured such that light emitted by the one or more LEDs 30 is incident upon an inside surface of lamp envelope 70 and dispersed outwardly through an outer surface of the lamp envelope 70.

Figure 2:
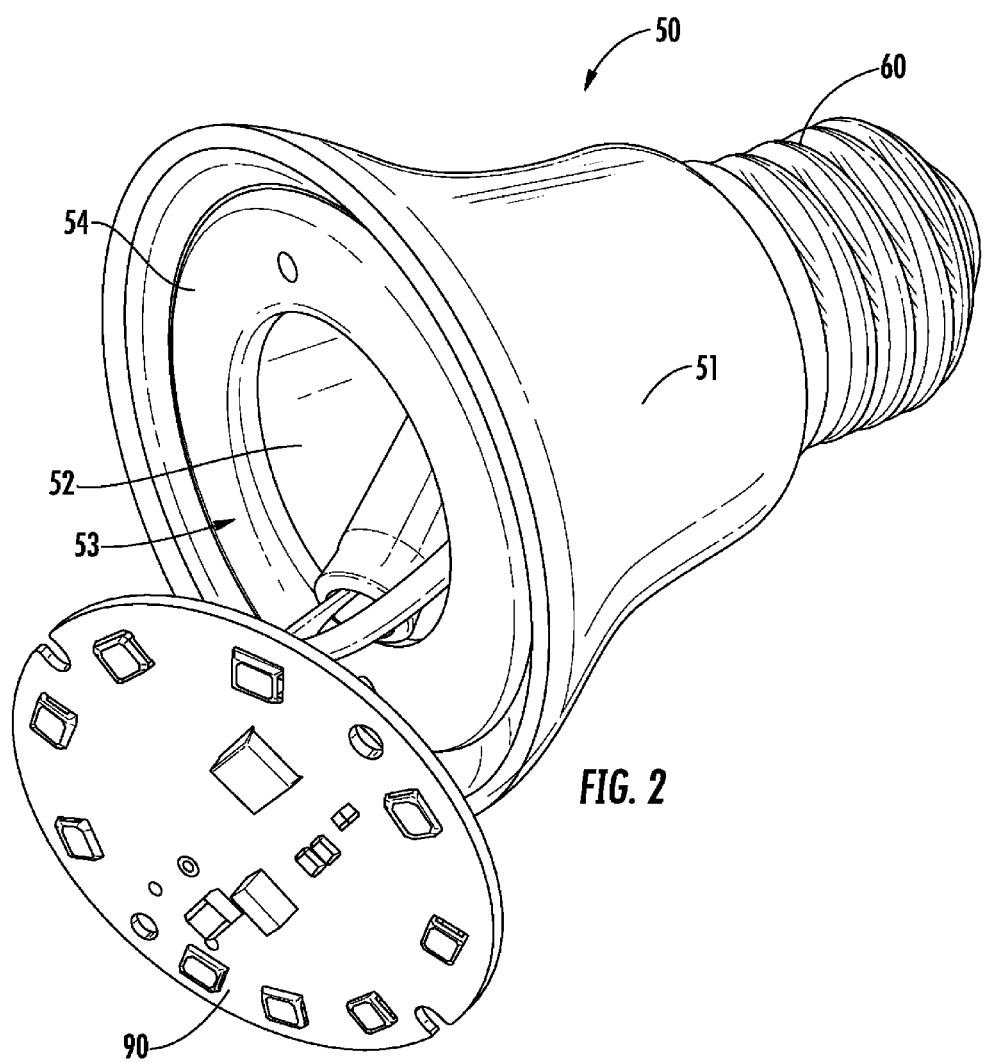
FIG. 2 is a perspective view of a portion of an LED lighting device, in accordance with various embodiments of the present invention.
Figure 3:
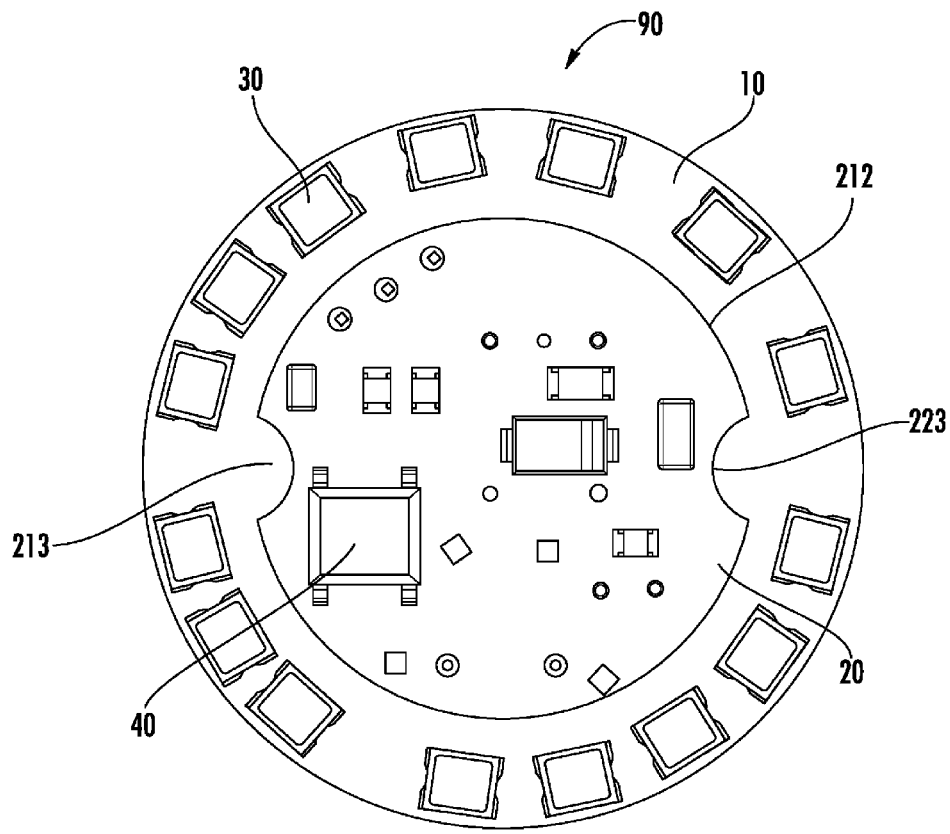
FIG. 3 is a structural representation of an LED module, in accordance with various embodiments of the present invention.
Figure 4:
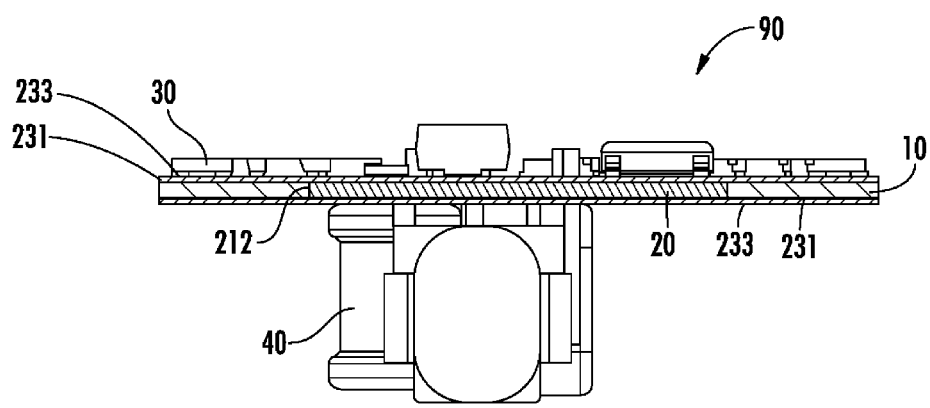
FIG. 4 is a sectional view of the LED module shown in FIG. 3.
Figure 5:
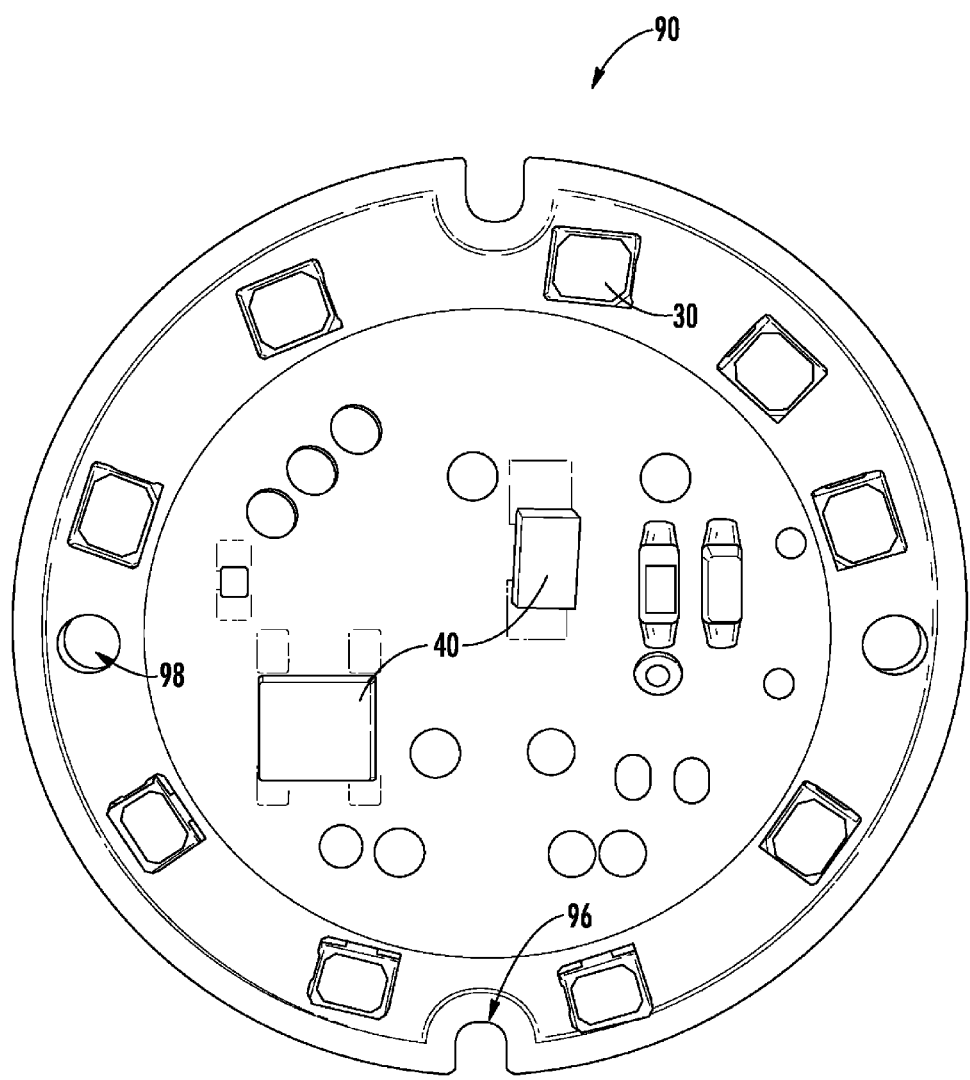
FIG. 5 is a perspective view of a first surface of an LED module, in accordance with various embodiments of the present invention.

The LED lighting device 100 may also comprise a housing 50. As shown in FIG. 2, the housing 50 may comprise a metal shell 52, a plastic housing 51, and a metal insert 54. In various embodiments, the metal shell 52 may be generally conical, funnel, or bell-shaped and thereby define a central opening 53. A plastic housing 51 may be over molded onto the metal shell 52 to provide the LED lighting device 100 with an aesthetically pleasing look and/or to provide the LED lighting device 100 with a look that is similar to the familiar appearance of an incandescent light bulb. A metal insert 54 may be mounted within the central opening 53 and configured to have an LED module 90 secured thereto.

II. EXEMPLARY LED MODULE

FIGS. 3-7 illustrate various view of example LED modules 90 that may be incorporated into the LED lighting device 100. In various embodiments, the LED module 90 comprises a peripheral metal board 10, a circuit board 20, one or more LEDs 30, one or more driver circuitry components 40, and connecting wires 35. In example embodiments, a blank circuit board 20 is embedded within a peripheral metal board 10 to provide a composite board. The composite board may be configured to structurally support one or more driver circuitry components 40 and one or more LEDs 30 and to dissipate and/or transfer heat created by the operation thereof.

A copper foil 234 may be adhered to the flush surface of the composite board (e.g., via a semi-dry adhesive that cures to provide an electric insulating layer). An etching process may be used to provide traces 233 from the copper foil. In various embodiments, a solder mask (e.g., a white solder mask) is printed on the composite board. One or more driver circuitry components 40 may be secured to the composite board in electrical communication with the traces 233 to provide driver circuitry for an LED module 90. In particular the one or more driver circuitry components 40 may be secured to sites on the composite board corresponding to the circuit board 20. Additionally, one or more LEDs 30 may be secured to the composite board in electrical communication with the traces 233 to be driven by the driver circuitry. In various embodiments, the one or more LEDs 30 are secured to sites on the composite board corresponding to the peripheral metal board 10. The driver circuitry and the one or more LEDs 30 may be operatively and directly connected via the copper traces 233.

In various embodiments, the peripheral metal board 10 may comprise an annular disk made of aluminum or other light weight metal having appropriate heat transfer properties, having an embedding opening 212 therethrough. For example, in one embodiment, the peripheral metal board 10 is a metal-core printed circuit board (MCPCB). In example embodiments, the thickness of the peripheral metal board 10 is generally 0.8-1.5 mm.

The circuit board 20 may be a blank circuit board made from FR-1, FR-4, or other laminated base plate. In various embodiments, the laminated base plate may be a multi-layered laminated base plate. For example, the laminated base plate may comprise a metal core such that circuit boards 20 made from the laminated base plate comprise a metal core. In various embodiments, the circuit board 20 may be and/or may be configured to be Computer Aided Manufacturing (CAM) PCB. In example embodiments, the thickness of the circuit board 20 is generally 0.8-1.5 mm.

In example embodiments, the circuit board 20 is embedded within the embedding opening 212 of the peripheral metal board 10. In various embodiments, the circuit board 20 is embedded within the embedding opening 212 such that a first surface of the circuit board 20 is generally flush with a first surface of the peripheral metal board 10. In various embodiments, the circuit board 20 and the peripheral metal board 10 are the same thickness and/or approximately the same thickness, and, thus, the circuit board 20 is embedded with the embedding opening 212 such that a second surface of the circuit board 20 is also generally flush with a second surface of the peripheral metal board 10. In an example embodiment, both the first surfaces of the peripheral metal board 10 and the circuit board 20 and the second surfaces of the peripheral metal board and the circuit board are exactly flush. In various embodiments, if the circuit board 20 has a metal core, the circuit board 20 is embedded within the peripheral metal board 10 such that the metal core of the circuit board 20 is in thermal communication with the peripheral metal board 10.

In various embodiments, the shape of the circuit board 20 matches the outer shape of the embedding opening 212 such that the circuit board 20 may be embedded into the embedding opening 212 to form the composite board. In various embodiments, the circuit board 20 may be round (e.g., a circle or ellipse), although other shapes are also contemplated. The embedding opening 212 may be shaped and sized to accommodate the circuit board 20 being embedded therein. In example embodiments, the circuit board 20 is press-fitted into the embedding opening 212. In such embodiments, the size of the embedding opening 212 is approximately the size of the circuit board 20. In various embodiments, the circuit board 20 may be secured within the embedding opening 212 with adhesive in place of and/or in addition to press-fitting. In various embodiments, the peripheral metal board 10 is round (e.g., a circle or ellipse). For example, the peripheral metal board 10 may be an annulus. In an example embodiment, the circuit board 20 defines a circle (e.g., the outer edge of the circuit board 20), the peripheral metal board 10 defines an annulus, and the circle and the annulus are concentric.

Once the circuit board 20 is embedded within the embedding opening 212, an electric insulation layer 231 (see FIG. 12) is applied to at least the first surface of the composite board. In various embodiments, the electric insulation layer 231 may be formed by curing a semi-dry or thermosetting adhesive onto the composite board. For example, a layer of insulating D3451 semi-dry adhesive may be uniformly coated on the first surface of the composite board. In one embodiment, the semi-dry adhesive is applied to both the first and second surfaces of the composite board. The semi-dry adhesive may further be used to adhere a copper foil 234 to the composite board. The copper foil 234 may then be etched to provide electrical traces 233 for operatively connecting the driver circuitry components 40, one or more LEDs 30, electrical connecting wires 35, and/or the like. For example, the copper foil 234 may be etched to form a composite printed circuit board (PCB) board. The composite PCB board may then be set with (a) one or more driver circuitry components 40 on the portion of the composite PCB board corresponding to the circuit board 20 and (b) one or more LEDS on the portion of the composite PCB board corresponding to the peripheral metal board 10 to form an LED module 90. This formulation of the LED module 90 allows the heat created by the operation of the one or more LEDs 30 to be easily radiated/transported away from the one or more LEDs 30 while providing a simplified structure for the driver circuitry and connecting the driver circuitry to the one or more LEDs 30.

Figure 7:
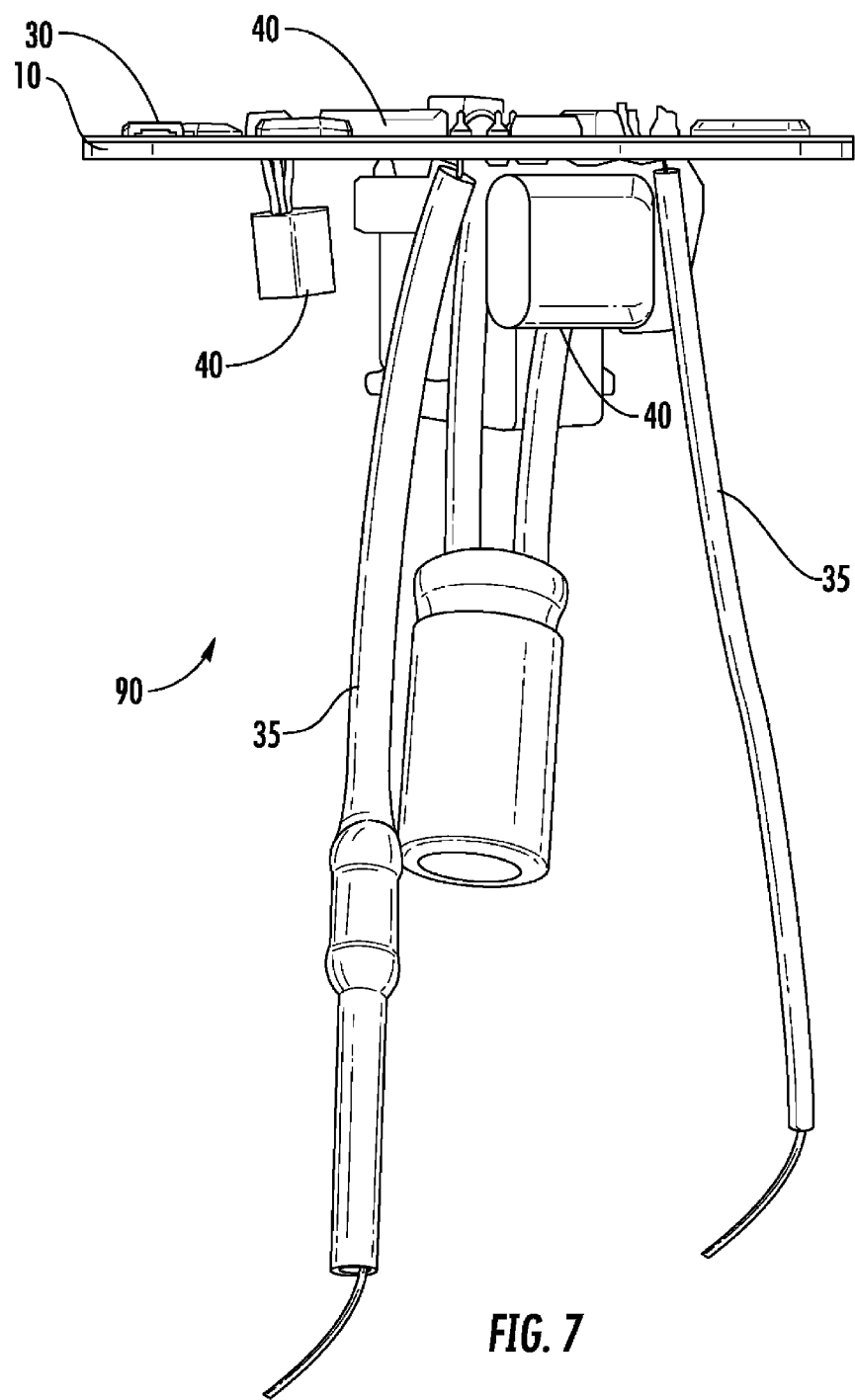
FIG. 7 is a side view of the LED module shown in FIGS. 5 and 6.

In some embodiments, the one or more LEDs 30 are mounted on traces 233 on a first surface of the composite PCB board and at least some of the driver circuitry components 40 are mounted to a second surface of the composite PCB board. For example, one or more LED chips and/or one or more LED packages may be mounted on the traces 233 on the first surface of the composite PCB board at locations corresponding to the peripheral metal board 10. For example, as shown in FIG. 7, at least some of the driver circuitry components 40 are mounted on the opposite surface of the composite PCB board as the one or more LEDs 30. In example embodiments, some driver circuitry components 40 are mounted on first surface of the composite PCB board and other driver circuitry components 40 are mounted on the second surface of the composite PCB board. For example, larger driver circuitry components 40 may be mounted to the second surface of the composite PCB board. Such a configuration may prevent the driver circuitry from interfering with light emitted by the one or more LEDs 30.

In various embodiments, a circular-shaped peripheral metal board 10 facilitates the placement of the one or more LEDs 30 in a circular shape. For example, the embedding opening 212 may be a circular hole coaxial with the peripheral metal board 10, so that the peripheral metal board 10 is in a shape of a circular ring (e.g., annulus), and the one or more LEDs 30 are set around the surface of the peripheral metal board 10 of circular shape. Such placement of the one or more LEDs 30 may be favorable for providing uniform light emitting of the LED module 90 (and therefor the LED lighting device 100), leads to increased uniformity in heat radiation of the heat created by the operation of the one or more LEDs 30, and at the same time, facilitates embedding of the circuit board 20 into the embedding opening 212 of the peripheral metal board 10.

In some embodiments, the periphery of the embedding opening 212 is set with semi-circular protrusions 213, and the said circuit board 20 is set with semi-circular notches 223 along its periphery to be adapted to the semi-circular protrusions 213. The semi-circular notches 223 of the circuit board 20 may be configured to engage with the semi-circular protrusions 213 of the peripheral metal board 10, which may enable accurate positioning between the circuit board 20 and the peripheral metal board 10 and may be favorable for increasing the engagement force between the circuit board 20 and the peripheral metal board 10 to enhance the strength of the composite board. In some embodiments, the outer edge of the circuit board 20 and the inner edge of the embedding opening 212 may be a circular (e.g., without any notches or protrusions).

In various embodiments, one or more alignment notches 96 are disposed on the outer edge of the peripheral metal board 10 and/or one or more attachment holes 98 are disposed near the periphery of the peripheral metal board 10. The alignment notches 96 may be configured to assist in the aligning of the LED module 90 into the appropriate position within an LED lighting device 100. In example embodiments, the attachment holes 98 may be configured to assist in the aligning and/or securing the LED module 90 to the LED lighting device 100.

In various embodiments, the circuit board 20 embedded within the metal disk 10 provides for driver circuitry components 40 to be mounted to both the first surface and the second surface of the circuit board 20. Driver circuitry components 40 mounted to the second surface of the circuit board 20 may extend into housing 50 of LED lighting device 100.

III. EXEMPLARY METHOD OF MANUFACTURING AN LED MODULE

Figure 8:
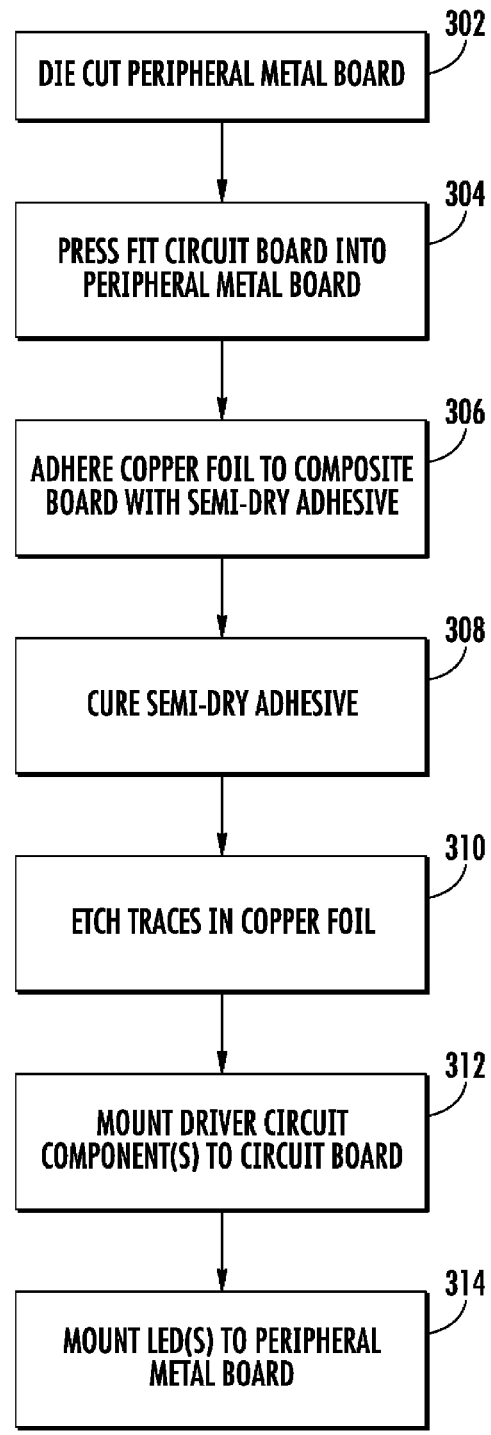
FIG. 8 is a flowchart illustrating various processes and procedures that may be completed in manufacturing an LED module, in accordance with various embodiments of the present invention.
Figure 9:
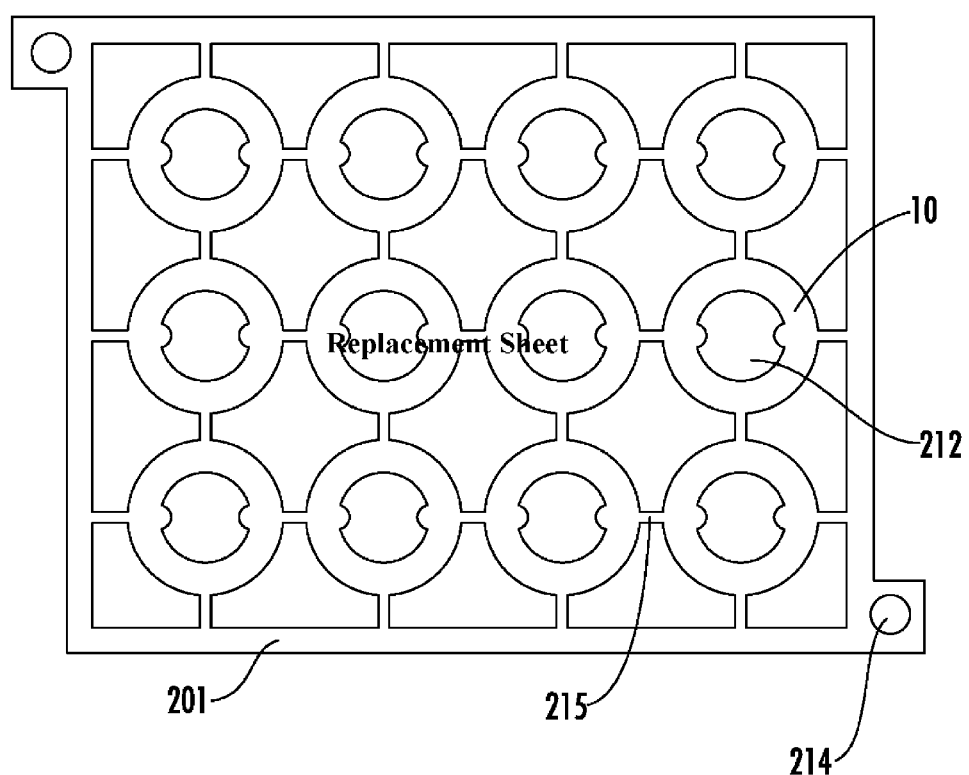
FIG. 9 is a diagram of a metal sheet that has been die stamped in order to create peripheral metal boards for use in LED modules, in accordance with various embodiments of the present invention.

FIG. 8 provides a flowchart illustrating an example method of manufacturing an LED module 90. Starting at step 302, the peripheral metal board 10 may be die cut. For example, a sheet of metal (e.g., aluminum) may be die cut to form one or more peripheral metal boards 10. For example, as shown in FIG. 9, in various embodiments, a punching die is used to die stamp one or more peripheral metal boards 10 of annular shape in a rectangular array on a metal sheet 201 (e.g., with thickness of 0.8-1.5 mm). In an example embodiment, the outer edges of two adjacent peripheral metal boards 10 are connected through the connection strips 215 with width of 0.5-1 mm. To facilitate subsequent processing of the metal sheet 201, locating holes 214 may also be die stamped at the diagonal positions of the metal sheet 201 when peripheral metal boards 10 are die stamped on the metal sheet 201.

At step 304, a blank circuit board 20 is press fit into the embedding opening 212 of the peripheral metal board 10. For example, circuit board 20 adapted to the embedding opening in outer shape and of thickness equal to that of peripheral metal board 10 is obtained by way of die stamping a laminated base plate (e.g., an FR-1, FR-4, multi-layered metal core laminated base plate, and/or the like). A circuit board 20 may then be embedded within at least one/each embedding opening 212 on the metal sheet 201 such that the first surface of the circuit board 20 is flush with the first surface of the peripheral metal board 10 and the second surface of the circuit board 20 is flush with the second surface of the peripheral metal board 10.

Figure 10:
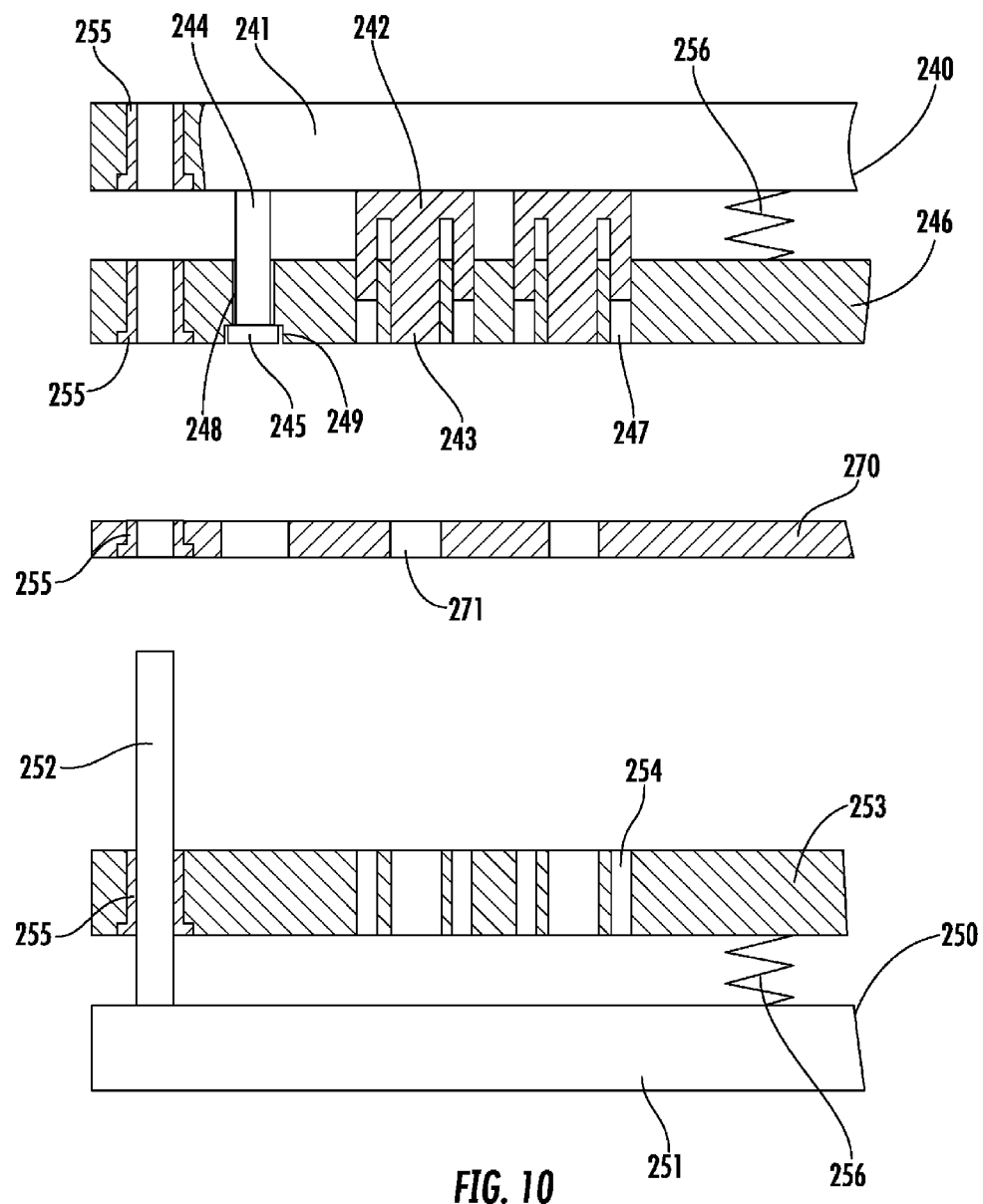
FIG. 10 is a schematic diagram of a punching die that may be used to create peripheral metal board for use in LED modules and/or to embed a circuit board within a peripheral metal board, in accordance with various embodiments of the present invention.
Figure 11:
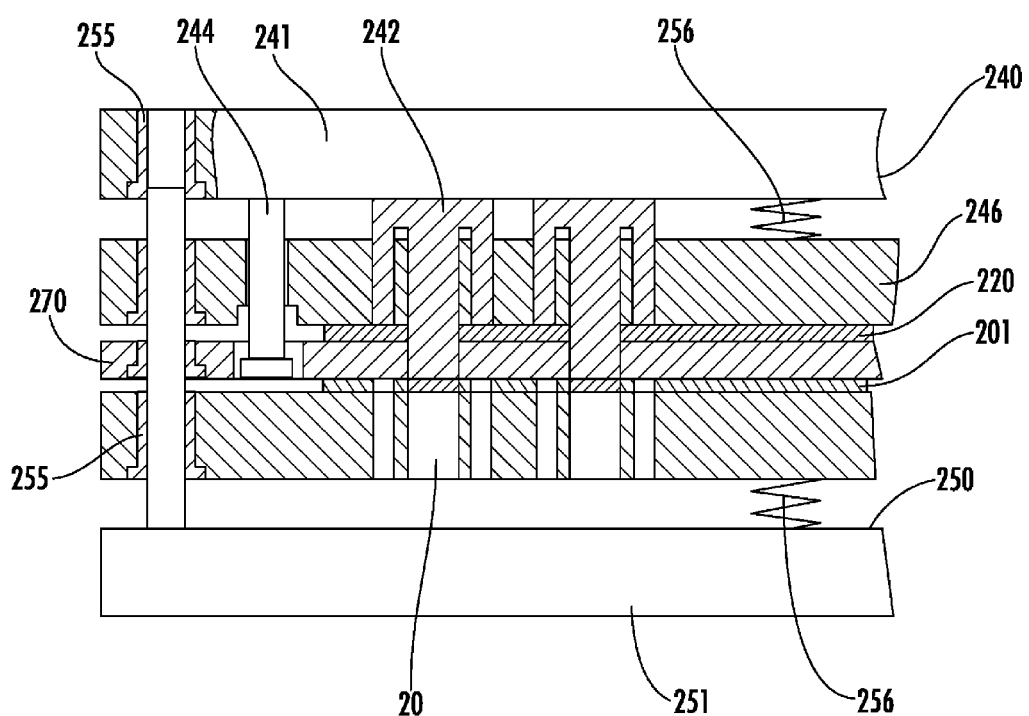
FIG. 11 is a schematic diagram of the state when the punching die shown in FIG. 10 performs the embedding of a circuit board into a peripheral metal board, in accordance with various embodiments of the present invention.

FIGS. 10 and 11 illustrate an example punching die that may be used to die stamp the peripheral metal board 10 and/or circuit board 20 and/or embed a circuit board 20 into embedding opening 212. As shown in FIG. 10, in various embodiments, the punching die comprises the upper die 240 and the lower die 250. The upper die 240 comprises the upper die holder 241 connected to the press, the punch 242 fixed to the upper die holder and the cylindrical sliding bar 244. The punch 242 comprises the punch main body 243 used to form the embedding opening 212 of the peripheral metal board 10. The lower surface of the punch main body 243 is higher than the lower surface of other parts of the punch 242. The lower part of the upper die holder 241 is also set with a stripper 246. The stripper 246 is set with the punch lead hole 247 adapted to the punch 242 to form a sliding connection with the punch. The stripper 246 may also be set with the bar lead hole 248 adapted to the vertical sliding bar 244, so that the stripper 246 can move up and down under the guide of the sliding bar 244. In addition, the lower end of the sliding bar 244 is set with a protruding ring to form the hook 245 that can hook and hang the stripper 246. An elastic component 256 is set between the stripper 246 and the upper die holder 241, so that the stripper is suspended at the hook 245 of the lower end of the sliding bar 244. In the state of the die stamp shown in FIG. 10, the lower end of the punch 242 is located inside the punch lead hole 247. The counterbore 249 may be set at the lower end of the bar lead hole of the stripper 246 so that the position of the hook 245 of the sliding bar 244 can be limited to inside the counterbore 249. The lower die 250 of the punching die comprises the lower die holder 251 connected to the press and the lower die plate 253 set on the lower die holder. The lower die plate 253 is set with the primary punch die hole 254 adapted to the punch 242. The vertically upward guide post 252 is set at the edge angle of the lower die holder 251. The guide sleeve 255 adapted to the guide post 252 is then respectively set on the lower die plate 251, the stripper 246, and the upper die holder 241, so that the upper die holder, the stripper, the lower die plate, and the lower die holder can be accurately positioned together through use of the guide post 252. Additionally, an elastic component 256 may be set between the lower die plate 253 and the lower die holder 251. A pressure spring or resilient block made of polyurethane are examples of the elastic component 256 that may be set between the stripper 246 and the upper die holder 241 and/or between the lower die plate 253 and the lower die holder 251. In addition, in various embodiments, the punching die further comprises an elevation die plate 270. The elevation die plate is set with the secondary punch die hole 271 adapted to the punch main body 243, and the edge angle of the elevation die plate is set with the guide sleeve 255 adapted to the guide post 252.

When die stamping the metal sheet 201, the metal sheet is first positioned on the lower die 250, the press is then started to make the upper die 240 move downward, the stripper 246 of the upper die first presses the metal sheet, the elastic component 256 between the stripper and the upper die holder 241 is compressed, the punch extends out of the punch lead hole to work with the primary punch die hole of the lower die plate to die stamp peripheral metal boards 10 interconnected with connection strips on the metal sheet, the punch main body knocks out the embedding opening 212 on the peripheral metal board 10, and the lower die plate also moves downward under pressure.

Next, the upper die 250 moves upward to return to the original position, the elastic component 256 between the stripper 246 and the upper die holder 241 makes the stripper continue its tight attachment to the lower die plate 253 to make the stripper and the upper die holder separate, and at this time, the punch retracts again into the punch lead hole 247 of the stripper, the die-stamped metal sheet 201 stays on the lower die 250, and with the continued upward movement of the upper die 240, the sliding bar 244 makes the stripper 246 move upward synchronously and mutually separate from the die-stamped metal sheet 201, and the lower die plate 253 moves upward to return to the original position.

Then, as shown in FIG. 11, the die-stamped metal sheet 201 is covered with the elevation die plate 270, and at this time, the guide sleeve 255 of the elevation die plate covers the guide post 252 of the lower die holder 251, so that the secondary punch die hole 271 of the elevation die plate is accurately positioned with the punch main body 243 above and the embedding opening 212 of the peripheral metal board 10 below. Then, the laminated base plate of the same thickness of the peripheral metal board 10 is placed on the elevation die plate 270, the press is started again to make the upper die 240 move downward. The stripper 246 of the upper die first presses the laminated base plate, the punch extends out of the punch lead hole 247, the punch main body 243 in the punch works with the secondary punch die hole 271 of the elevation die plate 270 to die stamp a mutually separated, blank circuit board 20 from the laminated base plate. The circuit board 20 continues to move downward under the drive of the punch main body 243 and is exactly embedded into the embedding opening 212 corresponding to the peripheral metal board 10 at the lower die 250 to form the composite board. In various embodiments, the height difference between the punch main body 243 and other parts of the punch is equal to the sum of the thicknesses of the elevation die plate 270 and the peripheral metal board 10, which thus makes sure that the circuit board 20 embedded into the embedding opening 212 of the peripheral metal board 10 is exactly flush with the first and second surfaces of the peripheral metal board 10.

At this time, other parts of the punch abut on the laminated base plate, so as to push the lower die plate 253 to move downward under pressure through the stacked laminated base plate, elevation die plate 270 and die-stamped metal sheet 201. The composite board inside the primary punch die hole 254 of the lower die plate 253 moves downward synchronously, and accordingly, the stripper of the lower die plate also abuts on the laminated base plate so as to be flush with other parts of the punch.

Finally, the upper die 240 moves upward again to return to the original position, the stripper 246 is separated from the upper die holder 241, the punch retracts again into the punch lead hole 247 of the stripper 246. The die-stamped metal sheet 201 comprising a plurality of peripheral metal boards 10 each and/or at least some of which have a circuit board 20 embedded therein stays on the lower die, so that a plurality of composite boards formed through the interconnection of the composite boards by the connection strips 214 is obtained.

Returning to FIG. 8, at step 306, a copper foil is adhered to the composite board using a semi-dry adhesive. For example, layer of insulating semi-dry adhesive 311 is uniformly coated on at least the first surface of the plurality of composite boards formed in the die stamped metal sheet 201. For example, a layer of insulating D3451 semi-dry adhesive may be uniformly coated on the first surface of the peripheral metal board 10 and circuit board 20 embedded therein. The semi-dry adhesive may be used to adhere a whole sheet of copper foil to the plurality of composite boards formed from embedding a plurality of circuit boards 20 into the plurality of peripheral metal boards 10 die stamped from the metal sheet 201.

Figure 12:
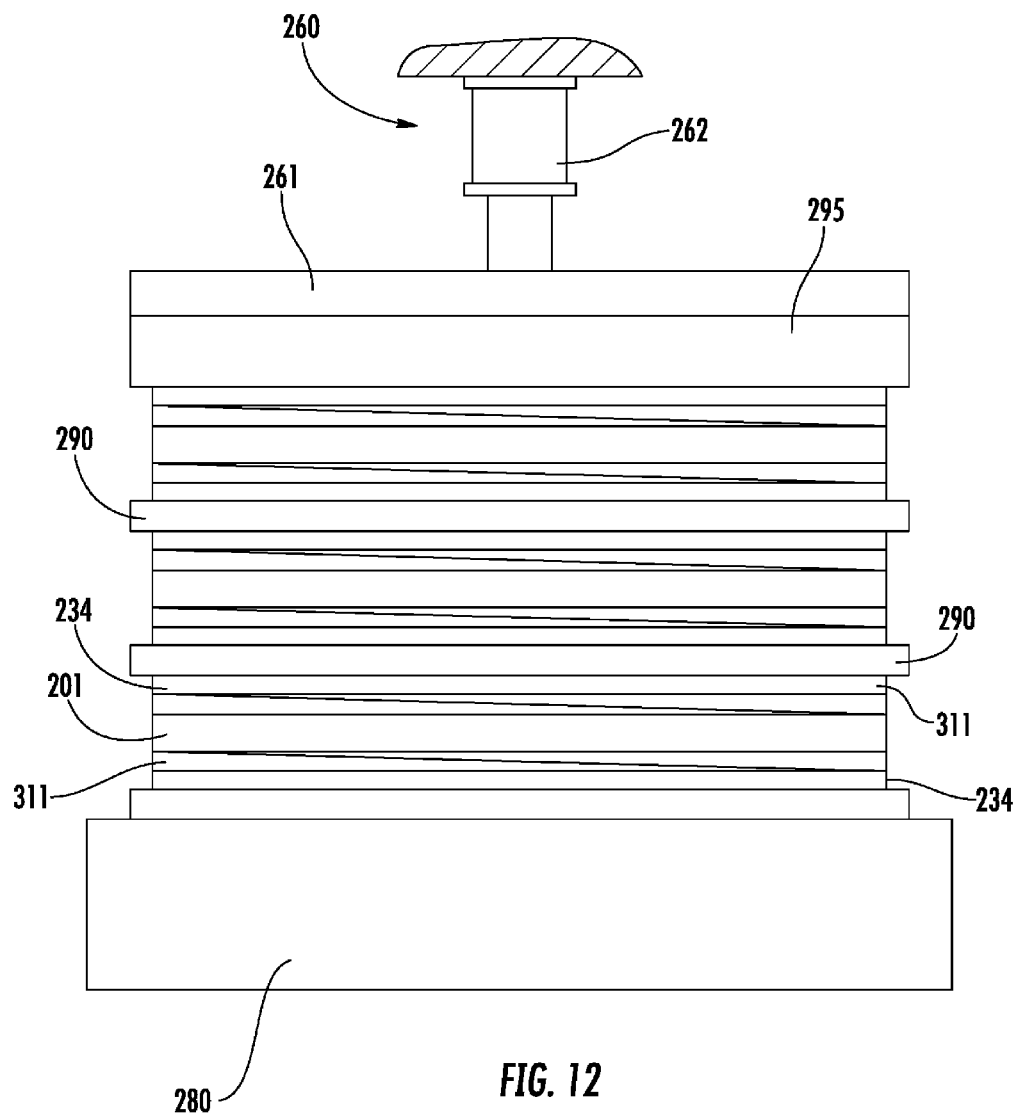
FIG. 12 is a schematic diagram of a pressure unit that may be used in the bonding of a copper foil to a circuit board and a peripheral metal board, in accordance with various embodiments of the present invention.
Figure 13:
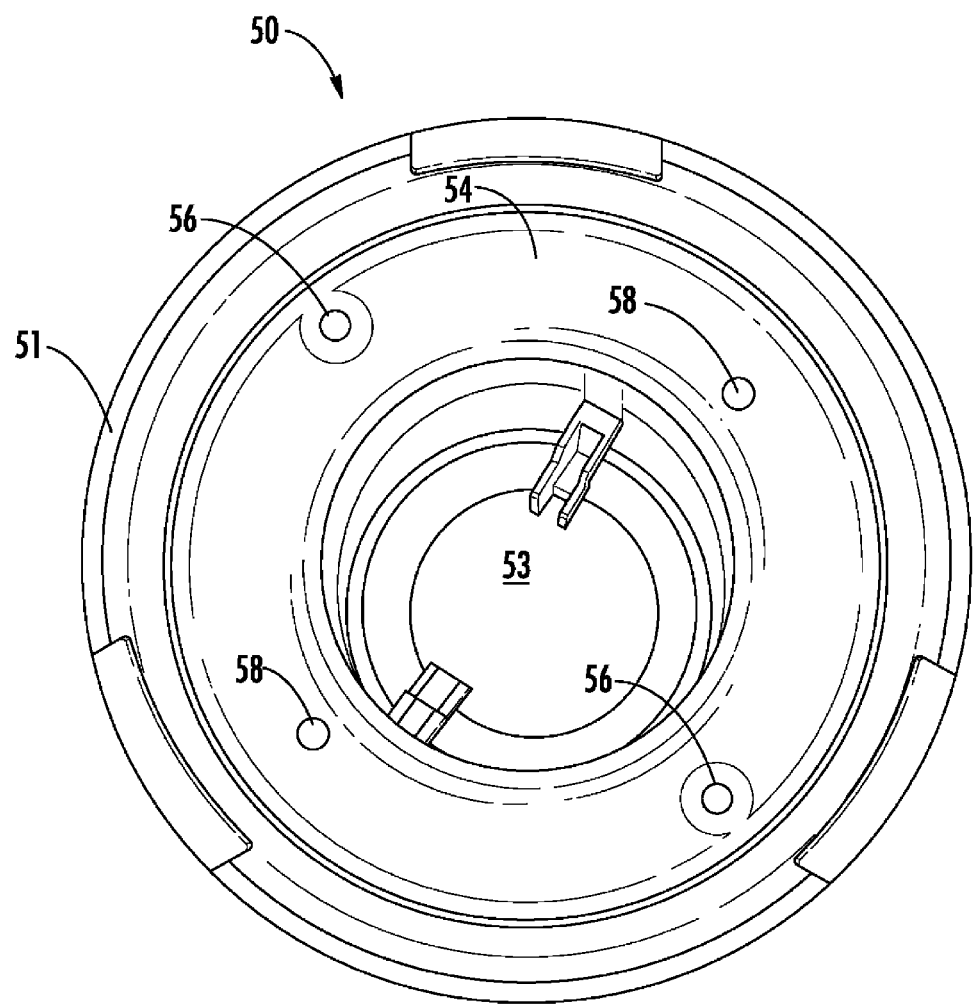
FIG. 13 is a top view of a housing of an LED lighting device, in accordance with an embodiment of the present invention.

At step 308, the semi-dry adhesive is cured to form the electric insulating layer 231. For example, constant pressure may be applied to the surface of the copper foil, which is baked at a temperature of 130°-180° C. for 45-60 minutes, so that the layer of semi-dry adhesive 311 is cured and forms an electric insulating layer 231. For example, as shown in FIG. 12, a plurality of metal sheets 201 bonded with the copper foil 233 through the semi-dry adhesive 232 may be stacked on a bearing platform 280 in a sealed drying room. The bearing platform may be set with the locating post corresponding to the locating hole 214 of the metal sheet, and in this way, the locating hole of the metal sheet 201 is set as a sleeve on the locating post of the bearing platform 280, so that accurate positioning can be kept for each layer of the metal sheets in between. Resilient sleeper bearings 290 made of high temperature-resistant silica gel may be laid between adjacent metal sheets 201. The thickness of the resilient sleeper bearing may be 1-1.5 mm, and a layer of resilient sleeper bearing 290 may also be laid under the bottom-layer metal sheet 201. The top-layer metal sheet 201 is then covered on the top with the flexible fluid bag 295 filled inside with liquid. The flexible fluid bag 295 is flat and rectangular in shape, and the size of the flexible fluid bag should be able to cover a whole sheet of copper foil 233. In addition, the flexible fluid bag is set on the top with the pressure unit 260. The pressure unit comprises the pressure plate 261 covering the flexible fluid bag 295 as well as the oil cylinder 262 above the pressure plate. The vertically downward piston rod of the oil cylinder 262 is connected to the pressure plate 261. In this way, when the oil cylinder 262 is operated, the piston rod can apply a pressure to the flexible fluid bag 295 through the pressure applied. The fluid in the flexible fluid bag 295 can transmit uniformly and consistently the pressure applied by the pressure unit to the top layer of the stacked metal sheets 201, so as to avoid inconsistency of pressure at various places of the metal sheets resulting from tiny errors of parallelism between the pressure plate 261 and the top-layer metal sheet. When tiny protuberances and impurities exist between two layers of metal sheets 201, because protuberances and impurities will be trapped in the resilient sleeper bearing 290, the resilient sleeper bearing may thus ensure that pressure can be uniformly and consistently transmitted between two layers of metal sheets 201, so as to apply a constant pressure on each layer of metal sheets and ensure that the copper foil 233 can be reliably bonded to the metal sheet through semi-dry adhesive 232.

At step 310, traces 233 are etched in the copper foil 234 to provide a composite PCB board. For example, traces 233 for operatively connecting the driver circuitry components 40 and/or the one or more LEDs 30 may be etched from the copper foil 234. For example, etching treatment is performed on the copper foil 234 on the surface of the composite board component according to a circuit diagram for the LED module 90, so that copper traces 233 for purpose of electric conduction is formed on the composite board. For example, an etching treatment may be performed on the copper foil 234 to create traces 233 for the driver circuitry at a location on the composite PCB board corresponding to the circuit board 20, traces 233 for mounting one or more LEDs 30 at a location on the composite PCB board corresponding to the peripheral metal board 10, and traces 233 for operatively connecting one or more driver circuitry components 40 and one or more LEDs 30.

In embodiments where a plurality of composite PCB boards are formed using a metal sheet 201, the connection strips 215 that connect each of the composite PCB boards are cut off, so that individual composite PCB boards are formed. Because the cross-section of the connection strip 215 is relatively small, in some embodiments, the composite boards may be manually twisted off. In some embodiments, all the connection strips 215 on the whole metal sheet 201 can be cut off at one time by way of die stamping, thereby greatly enhancing the production efficiency.

At step 312, one or more driver circuitry components 40 are operatively mounted to the composite PCB board at a location corresponding to the circuit board 20. For example, one or more driver circuitry components 40 are set on the composite PCB board at a site corresponding to the circuit board 20. For example, one or more driver circuitry components 40 may be disposed on traces 233 on the circuit board 20 to provide a driver circuitry configured to drive/operate one or more LEDs. In example embodiments, at least some of the one or more driver circuitry components 40 are mounted on a second surface of the composite PCB board. In various embodiments, at last one of the one or more driver circuitry components 40 is mounted on the first surface of the composite PCB board.

At step 314, one or more LEDs 30 (e.g., one or more LED chips and/or one or more LED packages) are operatively mounted to the composite PCB board at a location corresponding to the peripheral metal board 10. For example, one or more LEDs 30 are set on the composite PCB board at a site corresponding to the peripheral metal board 10. For example, one or more LEDs 30 may be set on traces 233 on the peripheral metal board 10. The traces 233 formed from the conductive copper foil 234 may be configured to operatively connect the one or more LEDs 30 mounted on the portion of the composite PCB board corresponding to the peripheral metal board 10 and the one or more driver circuitry components 40 mounted on the portion of the composite PCB board corresponding to the circuit board 20. In various embodiments, the one or more LEDs 30 are mounted on a first surface of the composite PCB board.

IV. EXEMPLARY LED LIGHTING DEVICE

In various embodiments, an LED lighting device 100 may be an LED light bulb, an LED lamp, an LED lighting or lamp fixture, and/or the like. As shown in FIGS. 1 and 2, various embodiments of an LED lighting device 100 comprise a base 60, a housing 50, an LED module 90, and a lamp envelope 70.

In general, the LED module 90 comprises one or more LEDs (e.g., one or more LED chips and/or one or more LED packages) and the circuitry required for operating the one or more LEDs. An example LED module 90 that may be used in an LED lighting device 100 is described above. In various embodiments, the one or more LEDs 30 may be an alternating current (AC) driven LED. In other embodiments, the one or more LEDs 30 may be a direct current (DC) driven LED. In some embodiments, no driver circuitry is necessary to operate the one or more LEDs 30.

In various embodiments, the driver circuitry (e.g., comprising one or more driver circuitry components 40) may comprise a circuit portion configured to convert AC voltage into DC voltage. In some embodiments, the driver circuitry may comprise a circuit portion configured to control the current flowing through the one or more LEDs 30. In certain embodiments, the driver circuitry may comprise a circuit portion configured to dim the one or more LEDs 30. In various embodiments, additional circuit components may be present in the driver circuitry. Similarly, in various embodiments, all or some of the circuit portions mentioned here may not be present in the driver circuitry. In some embodiments, circuit portions listed herein as separate circuit portions may be combined into one circuit portion. As should be appreciated, a variety of driver circuitry configurations are generally known and understood in the art and any of such may be employed in various embodiments as suitable for the intended application, without departing from the scope of the present invention.

The one or more LEDs 30 may be of various color temperatures or various colors. In various embodiments, the one or more LEDs 30 may be blue LEDs using phosphor to convert blue light to white light. In other embodiments, at least one of the one or more LEDs 30 may be a colored LED, such as a red, blue, green, or other colored LED. In various embodiments, different LEDs 30 secured within the same LED module 90 may have different color temperatures. In other embodiments, all LEDs 30 in the LED module 90 are designed to have approximately the same color temperature. For each embodiment, the color temperature of the one or more LEDs 30 may be chosen as appropriate for the expected use of the LED lighting device 100.

Figure 14A:
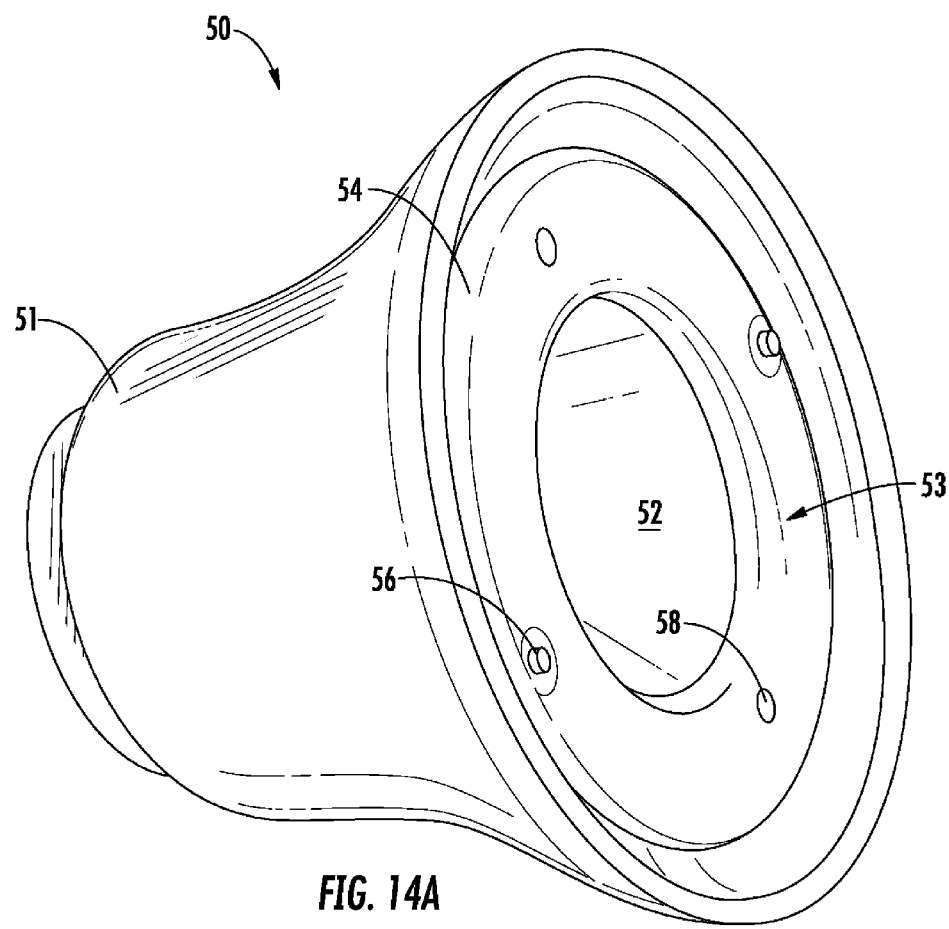
FIG. 14A is a perspective view of the housing shown in FIG. 13.
Figure 14B:
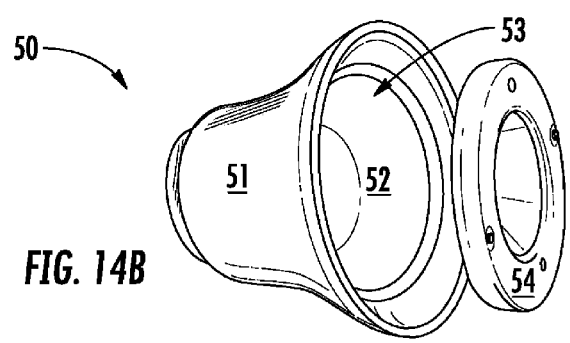
FIG. 14B is an exploded view of the housing shown in FIG. 14A.
Figure 15:
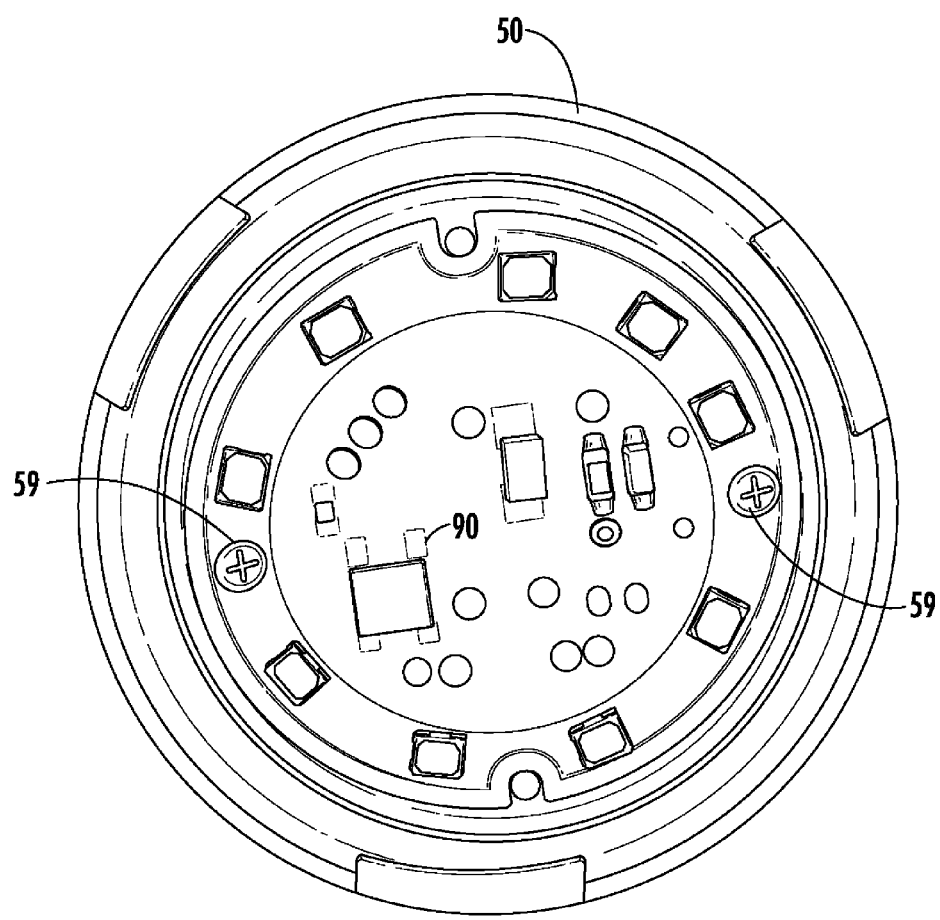
FIG. 15 is a perspective view of an LED module secured within an LED lighting device housing, in accordance with various embodiments of the present invention.

The LED module 90 may be configured to be secured to and/or within housing 50. For example, as shown in FIGS. 2, 13, 14A, 14B, and 15, the housing 50 may comprise a metal shell 52 with a plastic housing 51 molded thereover (e.g., via over molding). In example embodiments, the metal shell 52 may be generally conical, funnel, or bell-shaped and define a central opening 53 therein. In example embodiments, the overall shape is the same or similar to standard lamp form factors. The housing 50 may further comprise a metal insert 54 secured within the central opening 53 and/or within the mouth of the central opening. In various embodiments, the metal insert 54 may be configured to secure the LED module 90 to the housing 50 (e.g., within the central opening 53 and/or approximately flush with the mouth of the central opening 53) and place the LED module 90 in thermal communication with the metal shell 52. For example, the metal shell 52 may be configured to act as a heat sink for the LED lighting device 100. In various embodiments, the metal insert 54 and the metal shell 52 may be one piece of metal and/or integrally formed with the metal shell 52. In other embodiments, the metal insert 54 and metal shell 52 are formed separately and the metal insert 54 is then secured within the central opening 53 of the metal shell 52. For example, the metal insert 54 may be press-fitted and/or adhered within the central opening 53 of the metal shell 52. For example, FIG. 14B shows an exploded view of the housing 50 before the ring or annulus shaped metal insert 54 is secured within the central opening 53 and FIG. 14A shows a perspective view of the housing 50 after the ring or annulus shaped metal insert is press-fitted into the central opening 53 of the metal shell 52.

As described above, the LED module 90 may comprise one or more alignment notches 96 and/or one or more attachment holes 98. The metal insert 54 and/or a portion of the metal shell 52 may comprise corresponding alignment posts 56 and/or attachment holes 58. For example, the one or more alignment notches 96 may be configured to engage one of the one or more alignment posts 56 therein when the LED module 90 is secured to metal insert 54. In another example, the one or more attachment holes 98 of the LED module 90 may be configured to align with a corresponding attachment hole 58 of the metal insert 54 such that a fastener 59 (e.g., a screw, rivet, and/or the like) may be threaded and/or disposed therein for securing the LED module 90 to the metal insert 54. Thus, the LED module 90 may be quickly and easily aligned to the metal insert 54 and/or metal shell 52 and secured thereto.

In various embodiments, the LED lighting device 100 may define a symmetry axis. For example, the exterior of the LED lighting device 100 may define an axis of rotational symmetry. For example, the cross-section of the base 60, housing 50, and lamp envelope 70 perpendicular to a symmetry axis may all be approximately circular. For example, the housing 50 may define an axis along the length of the housing 50. The composite board (e.g., the peripheral metal board 10 with the circuit board 20 embedded therein) defines a plane. In example embodiments, when the LED module 90 is secured within the housing 50, the plane defined by the composite board may be perpendicular to the axis of the housing and/or LED lighting device 100. For example, in FIG. 15, the axis of the housing 50 may be coming out of the page and the plane defined by the LED module 90 is in the plane of the page.

Figure 6:
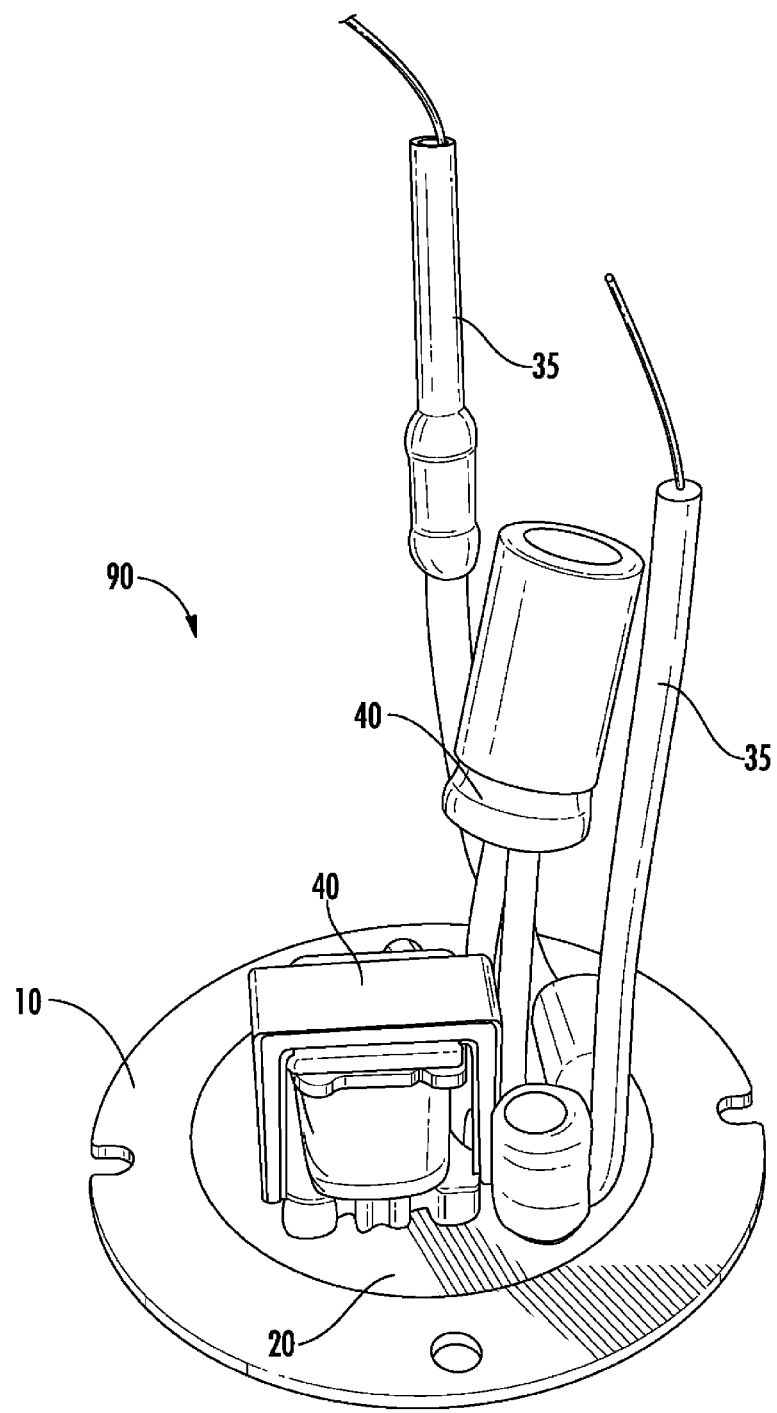
FIG. 6 is a perspective view of a second surface of the LED module shown in FIG. 5.

As shown in FIGS. 6 and 7, the LED module may comprise connecting wires 35. The connecting wires 35 may be in electrical communication with one or more driver circuitry components 40 (e.g., via traces 233). The connecting wires 35 may be configured to provide an electric current (e.g., from line voltage, a battery, etc.) to the driver circuitry of the LED module 90. In various embodiments, the connecting wires 35 may be secured to electrical contacts on the base 60 such that when the LED lighting device 100 is secured within a socket, the driver circuitry of the LED module 90 is placed in electrical communication with a power source (e.g., line voltage, a battery, etc.).

V. EXEMPLARY METHOD OF MANUFACTURING AN LED LIGHTING DEVICE

Figure 16:
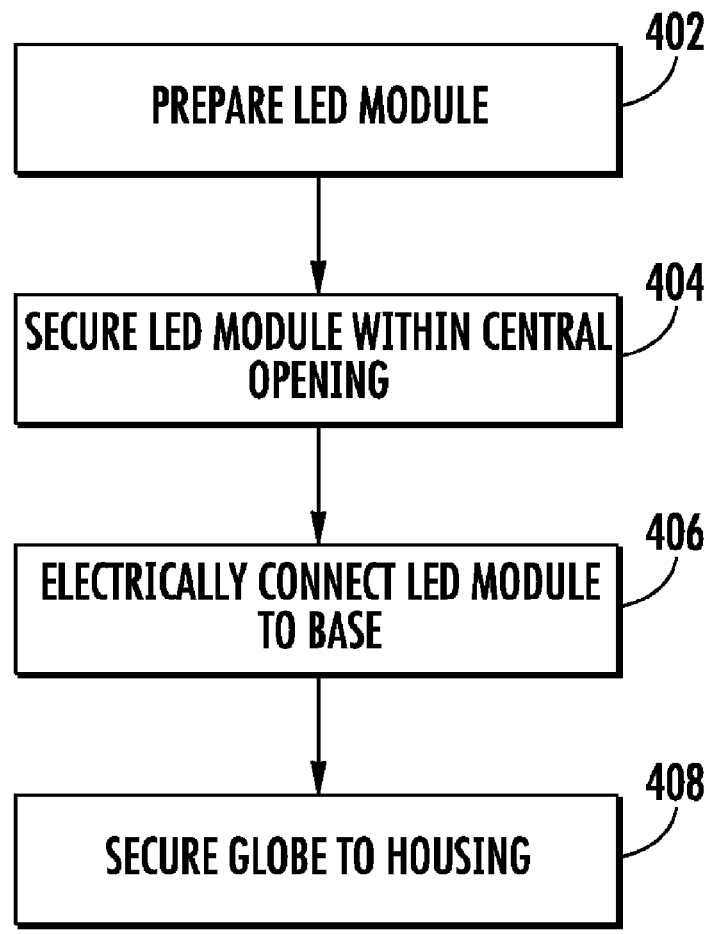
FIG. 16 is a flowchart illustrating various processes and procedures that may be completed in manufacturing an LED lighting device, in accordance with various embodiments of the present invention.

FIG. 16 provides a flowchart of an exemplary method of manufacturing an LED lighting device 100. Starting at step 402, an LED module 90 is prepared. In example embodiments, an LED module 90 may be prepared as described above with respect to FIG. 8.

At step 404, the LED module 90 may be secured within the central opening 53 of the housing 50. For example, the LED module 90 may be secured to the metal insert 54 such that the driver circuitry components 40 mounted to the second surface of the composite board are disposed within the central opening 53 of the housing 50 and the one or more LEDs 30 are positioned to emit light in a direction generally outward from the central opening 53. Any alignment notches 96 of the LED module 90 may be aligned with the corresponding alignment posts 56 of the metal insert 54 and any attachment holes 98 of the LED module 90 may be aligned with corresponding attachment holes 58 of the metal insert 54. Fasteners 59 may then be used to secure the LED module 90 to the housing (e.g., the metal insert 54). In some embodiments a thermal grease may be used to secure the LED module 90 to the housing 50 and/or to ensure good thermal communication between the peripheral metal board 10 of the LED module 90 and the metal insert 54 and/or metal shell 52.

At step 406, the LED module 90 may be electrically connected to the base 60. For example, the connecting wires 35 may be electrically connected to electrical contacts of the base 60. For LED lighting devices 100 that do not comprise a base 60, the connecting wires 35 may be electrically connected to other circuitry of the LED lighting device 100, connected to a power supply (e.g., line voltage, batteries, etc.), and/or the like. Additionally, the base 60 may be secured to the housing 50.

At step 408, the lamp envelope 70 may be secured to the housing 50. For example, the lamp envelope 70 may be secured to the housing 50 such that the LED module 90 is enclosed in the central opening 53 by the lamp envelope 70. In various embodiments, the lamp envelope 70 may be snapped onto, threaded onto, glued onto, and/or otherwise secured to the housing 50.

VI. CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A light emitting diode (LED) lighting device comprising:
   a housing comprising a metal shell and a central opening, said central opening being defined by said metal shell; and
   an LED module having one or more LEDs mounted about a periphery of a first surface of the LED module,
   wherein:
      the LED module comprises a double-sided circuit board, a first driver circuit component, and a second driver circuit component, the first driver circuit component mounted to a first surface of the double-sided circuit board and the second driver circuit component mounted to a second surface of the double-sided circuit board, the second surface being opposite said first surface,
      the LED module is oriented and retained, at least in part, within the central opening of the housing such that the first surface faces out of the central opening, and
      the LED module is secured to the housing via the metal shell.

2. The LED lighting device according to claim 1, wherein the housing further comprises a metal insert arranged adjacent the central opening of the housing, the metal insert comprising a second central opening.

3. The LED lighting device according to claim 2, wherein the second central opening is concentric with the central opening of the housing.

4. The LED lighting device according to claim 2, wherein the LED module is secured to the metal insert.

5. The LED lighting device according to claim 2 wherein the metal insert is press-fitted within the central opening of the housing.

6. The LED lighting device according to claim 2 wherein the LED module is in thermal communication with either the metal shell, the metal insert, or both.

7. The LED lighting device according to claim 1, wherein the LED module further comprises:
   a peripheral metal board abutting and about said circuit board;

an electrical insulation layer on said double-sided circuit board and on said peripheral metal board;
electrical traces on said electrical insulation layer; and
one or more LEDs operatively mounted on said peripheral metal board.

8. The LED lighting device according to claim 1 wherein said housing further comprises a plastic housing that is over-molded onto said metal shell.

9. The LED lighting device according to claim 1 wherein said housing defines an axis along a length of said housing, and wherein said LED module is configured to be oriented perpendicular to the axis of said housing.

10. The LED lighting device according to claim 1 wherein said LED module further comprises a peripheral metal board abutting and about said circuit board, said one or more LEDs mounted to a first surface of said peripheral metal board.

11. The LED lighting device according to claim 10 wherein an outer edge of said circuit board defines a first circle and an outer edge of said peripheral metal board defines a second circle and wherein said first circle and said second circle are concentric.

12. The LED lighting device according to claim 1, wherein said LED module comprises a peripheral metal board abutting and about said double-sided circuit board, wherein said double-sided circuit board is a multi-layered circuit board having a metal core and wherein said peripheral metal board is in thermal communication with said metal core.

13. A light emitting diode (LED) lighting device comprising:
a housing comprising:
a metal shell defining a central opening of the housing;
a plastic housing over molded onto the metal shell; and
a metal insert mounted adjacent and concentric to the central opening of the housing; and
an LED module mounted, at least in part, within the central opening of the housing and comprising:
a composite board having a first surface and a second surface opposite the first surface, the composite board comprising:
a peripheral metal board having an embedding opening; and
a circuit board embedded within the embedding opening of the peripheral metal board;
one or more driver circuitry components mounted to the first surface of the composite board and within a first portion of the composite board corresponding to the circuit board;
one or more driver circuitry components mounted to the second surface of the composite board and within the first portion of the composite board corresponding to the circuit board; and
one or more LEDs mounted to the first surface of the composite board and about a periphery of a second portion of the composite board corresponding to the peripheral metal board.

14. A light emitting diode (LED) lighting device comprising:
a housing comprising a metal shell and a central opening, said central opening defined by said metal shell; and
an LED module comprising:
one or more LEDs,
a double-sided circuit board, and
a peripheral metal board abutting and about said double-sided circuit board, wherein:
said one or more LEDs mounted to a first surface of said peripheral metal board,
the LED module is oriented and retained, at least in part, within the central opening of the housing such that the first surface faces out of the central opening, and
the LED module is secured to the housing via the metal shell.

15. The LED lighting device according to claim 14, wherein the housing further comprises a metal insert arranged adjacent the central opening of the housing, the metal insert comprising a second central opening.

16. The LED lighting device according to claim 15, wherein the second central opening is concentric with the central opening of the housing.

17. The LED lighting device according to claim 15 wherein the LED module is in thermal communication with either the metal shell, the metal insert, or both.

18. The LED lighting device according to claim 14 wherein said housing further comprises a plastic housing that is over-molded onto said metal shell.

19. The LED lighting device according to claim 14 wherein said housing defines an axis along a length of said housing, and wherein said LED module is configured to be oriented perpendicular to the axis of said housing.

20. The LED lighting device according to claim 14, wherein said double-sided circuit board is a multi-layered circuit board having a metal core and wherein said peripheral metal board is in thermal communication with said metal core.

* * * * *